United States Patent
Hineman

(10) Patent No.: US 6,638,843 B1
(45) Date of Patent: Oct. 28, 2003

(54) METHOD FOR FORMING A SILICIDE GATE STACK FOR USE IN A SELF-ALIGNED CONTACT ETCH

(75) Inventor: Max F. Hineman, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/533,697

(22) Filed: Mar. 23, 2000

(51) Int. Cl.[7] .................................... H01L 21/4763
(52) U.S. Cl. .................. 438/592; 438/655; 438/664; 438/301; 438/303
(58) Field of Search ................. 438/592, 655, 438/664, 300–301, 303, 253

(56) References Cited

U.S. PATENT DOCUMENTS

| 5,206,187 A | | 4/1993 | Doan et al. | |
|---|---|---|---|---|
| 5,258,096 A | | 11/1993 | Sandhu et al. | |
| 5,338,700 A | * | 8/1994 | Dennison et al. | 438/253 |
| 5,372,673 A | | 12/1994 | Stager et al. | |
| 5,688,706 A | | 11/1997 | Tseng | |
| 5,783,496 A | | 7/1998 | Flanner et al. | |
| 5,804,506 A | | 9/1998 | Haller et al. | |
| 5,854,135 A | * | 12/1998 | Ko | 438/712 |
| 5,863,820 A | | 1/1999 | Huang | |
| 5,869,374 A | * | 2/1999 | Wu | 438/291 |
| 5,880,019 A | | 3/1999 | Hsieh et al. | |
| 5,897,372 A | | 4/1999 | Howard | |
| 5,915,181 A | | 6/1999 | Tseng | |
| 5,945,698 A | | 8/1999 | Prall | |
| 5,948,701 A | | 9/1999 | Chooi et al. | |
| 5,981,383 A | * | 11/1999 | Lur et al. | 438/655 |
| 6,025,255 A | * | 2/2000 | Chen et al. | 438/595 |
| 6,033,962 A | * | 3/2000 | Jeng et al. | 438/301 |
| 6,037,216 A | * | 3/2000 | Liu et al. | 438/253 |
| 6,096,595 A | * | 8/2000 | Huang | 438/238 |
| 6,124,192 A | * | 9/2000 | Jeng et al. | 438/597 |
| 6,130,137 A | * | 10/2000 | Prall et al. | 438/384 |
| 6,133,096 A | * | 10/2000 | Su et al. | 438/264 |
| 6,165,910 A | * | 12/2000 | Flanner et al. | 438/743 |
| 6,174,775 B1 | * | 1/2001 | Liaw | 438/283 |
| 6,177,340 B1 | * | 1/2001 | Yoo et al. | 438/637 |
| 6,180,468 B1 | * | 1/2001 | Yu et al. | 438/297 |
| 6,248,652 B1 | * | 6/2001 | Kokubun | 438/585 |

* cited by examiner

Primary Examiner—Carl Whitehead, Jr.
Assistant Examiner—Thanh Nguyen
(74) Attorney, Agent, or Firm—Dickstein Shapiro Morin & Oshinsky LLP

(57) ABSTRACT

A method for forming a gate stack having a silicide layer that can subsequently undergo a SAC etch is disclosed. The present method provides a layer of insulating material on top of the silicide layer. The insulating material is sufficient to protect the gate stack, including the silicide layer when the low-resistance gate stack is used in subsequent self-aligned contact etch processes.

34 Claims, 7 Drawing Sheets

METHOD FOR FORMING A SILICIDE GATE STACK FOR USE IN A SELF-ALIGNED CONTACT ETCH

FIELD OF THE INVENTION

The present invention relates to the field of semiconductor integrated circuits and, in particular, to a silicide structure capable of use in a self-aligned contact (SAC) etch.

BACKGROUND OF THE INVENTION

Semiconductor integrated circuits with high device density require the patterning of closely spaced features including, for example, active areas, insulation structures, gates for field effect transistors, narrow conductors and interconnection lines, among others.

The formation of such polysilicon, metal, or insulation structures typically requires definition of the features in structures in a layer of photoresist, on a layer of polysilicon or insulator, by exposure of the photoresist with light passing through a reticle or photomask containing the desired pattern. After exposure and development of the photoresist, the underlying layer of the substrate is etched using the patterned photoresist as a template. The masking material protects designated areas of the substrate from the etch process. Subsequent processing steps are determined according to the type of device to be fabricated.

During these processing steps, problems with the misalignment of successive mask patterns relative to one another often occur. For example, deposited contacts might not line up correctly inside contact holes, source and drain regions might not line up perfectly relative to the gate region, and connections that must be physically close, but require electrical isolation from one another, might develop short circuits.

In an effort to reduce the misalignment problems of successive mask patterns, different techniques have been introduced into the IC fabrication. One of them is the salicide (self-aligned silicide) process, where a layer of polysilicon is first patterned so that a metal deposited over the wafer could then be annealed to form a metal silicide only in the area with exposed polysilicon. The salicide process relies on the fact that certain metals, such as cobalt or titanium, react under high temperatures with silicon to form conductive silicides, but do not react with silicon oxide. The unreacted metal is subsequently etched away, leaving the silicide self-aligned to the polysilicon, and automatically aligned to gate and source/drain regions. The metal in the silicide confers a lower resistance to the gate stack line, which, in turn, increases the speed of the devices.

Another technique commonly used to align a contact with an active area is the self-aligned contact (SAC) process, which involves an anisotropic etch to form a via or a contact hole that passes through the oxide layer down to the source/drain surface. The contact hole may not be perfectly aligned with the source and drain because spacers shield the vertical walls of the gate. Spacers, however, are very thin at the top of a gate and the etch-through of the top spacers during the SAC cannot be avoided. Accordingly, the polysilicon gate is typically covered with a silicon nitride or TEOS layer to form a dielectric cap material covering the gate to protect it during a SAC etch. During the formation of the contact hole in a SAC etch, a certain amount of the nitride material is removed but a sufficient amount remains so that when conductive material is deposited in the contact hole it does not short to the gate.

Until recently, logic and memory devices were packed separately, on different chips. The salicide process was used mainly for logic circuits because it made possible higher circuit performance. Similarly, the SAC process was employed primarily for memory circuits because it allowed the reduction of the cell size of the memory unit while achieving correct contact/active area alignment. As long as the logic and memory units were on separate chips, each of the two processes could be used separately without any effect on each other or implication on the overall circuit performance.

Recently, however, advanced semiconductor chips manufactured in the industry are composed of both logic and memory devices. Thus, for performance and cost reasons, current IC integration dictates the placing of logic and memory circuit on the same chip. Further, as the feature sizes continue to decrease, it may become necessary for memory chips to use low resistance gate materials, even if the memory chips are not embedded with logic devices on the same chip.

Efforts in the semiconductor industry attempting to incorporate both logic and memory applications on a single semiconductor chip have been increasing. Nevertheless, while there are many references to both the salicide and the SAC processes, only few address their actual integration.

For example, U.S. Pat. No. 5,863,820 to Huang describes a process for the integration of SAC and salicide processes on one chip, in which the polysilicon gate pedestals are formed first, those in the memory area having a silicon nitride on top. Subsequently, spacers are grown on the vertical walls of the gate pedestals and source and drain regions are formed. The gate pedestals on the memory side are then given a protective coating of oxide (RPO). This protective coating allows the salicide process to be selectively applied only to the logic side. Once the logic side is protected, a SAC process is applied to the memory side.

The methods developed by the prior art, however, do not specifically address the problems imposed by the actual simultaneous integration of the salicide and SAC processes on the same area of the chip. For example, when a SAC process is integrated with a salicide process, further adjustments and changes are required in the etch rate, selectivity, and profile control, to name just few of them. In particular, etch selectivity is a critical issue because the current salicide gate stacks are formed without a cap layer over the top of the gate. As described above, a SAC etch process is used to allow larger contacts to be patterned without shorting the contact to the gate by etching the contact selective to a cap material formed over the gate. Thus, although metal silicides confer low resistance to gate stacks, the current gate stacks cannot undergo subsequent SAC processes because the metal silicides formed by a salicide process lack a suitable cap material.

Accordingly, there is a need for an improved method by which the SAC and the salicide processes can be used together on one chip. That is, what is needed is a silicide gate structure that can be subsequently etched under a SAC method.

SUMMARY OF THE INVENTION

The present invention provides a method for forming a silicide gate stack that can subsequently undergo a SAC etch. The present method leaves a layer of cap material on top of the silicide gate, which is sufficiently thick to protect the gate during the SAC etch. The deposited cap material is suitable for subsequent SAC processes used in contact definition at sub −0.5 micron dimensions.

Additional advantages of the present invention will be more apparent from the detailed description and accompanying drawings, which illustrate preferred embodiments of the invention.

DETAILED DESCRIPTION OF THE PREFERRED EMBODIMENTS

In the following detailed description, reference is made to various specific embodiments in which the invention may be practiced. These embodiments are described with sufficient detail to enable those skilled in the art to practice the invention, and it is to be understood that other embodiments may be employed, and that structural, logical, and electrical changes may be made.

The terms "wafer" or "substrate" used in the following description may include any semiconductor-based structure that has an exposed silicon surface. Wafer and structure must be understood to include silicon-on insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide. When reference is made to a wafer or substrate in the following description, previous process steps may have been utilized to form regions or junctions in the base semiconductor or foundation.

The term "silicon dielectric" is used to indicate a silicon-based dielectric material such as silicon nitride or other silicon-based dielectrics with similar chemical characteristics, such as silicon oxide, silicon oxynitride, silicon oxime, and ONO (oxide-nitride-oxide) materials. The following detailed description is, therefore, not to be taken in a limiting sense, and the scope of the present invention is defined by the appended claims.

The present invention provides a method for forming a silicide gate stack that can subsequently undergo a SAC etch. The present method leaves a layer of cap material on top of the silicide gate. The deposited cap material is suitable for subsequent SAC processes used in contact definition at submicron dimensions.

Figure 1:
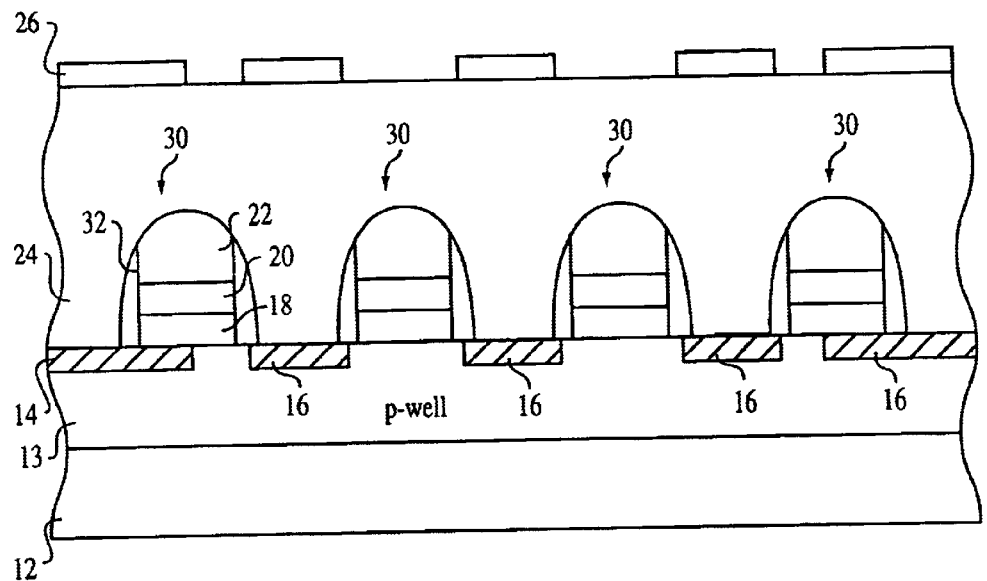
FIG. 1 is a schematic cross-sectional view of a portion of a conventional memory DRAM device just prior to the formation of a self-aligned contact etch.

To illustrate this, FIG. 1 depicts a conventional memory cell construction for a DRAM at an intermediate stage of the fabrication, in which a representative substrate is etched according to a conventional SAC etch process. A pair of memory cells having respective access transistors are formed within a substrate 12. The wells and transistors are surrounded by a field oxide region 14 that provides isolation. N-type active regions 16 are provided in a doped p-type well 13 of substrate 12 (for NMOS transistors) and the pair of access transistors have respective gate stacks 30.

An insulating layer 24 of, for example, BPSG has been applied over the substrate and transistor structures and a mask layer 26 having openings for etching the insulating layer to form contact openings to active regions 16 are also shown. A self-aligned contact etch of the insulating layer 24, to provide contact openings down to the active regions 16, is performed next.

Figure 2:
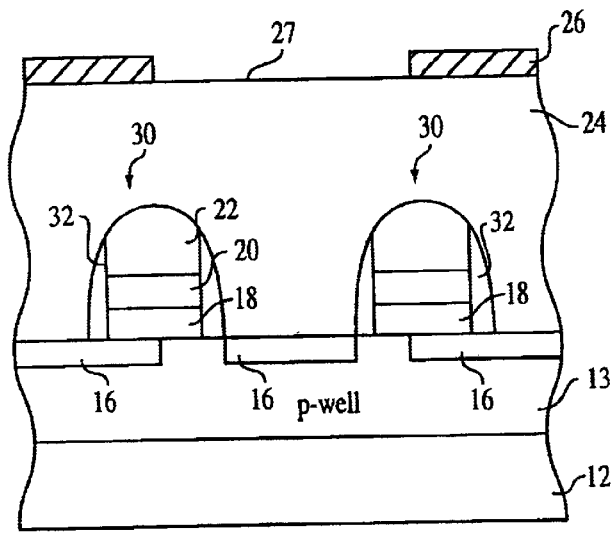
FIG. 2 is a schematic cross-sectional view of the FIG. 1 device at the beginning of a self-aligned contact etch conducted in accordance with a method of the prior art.
Figure 3:
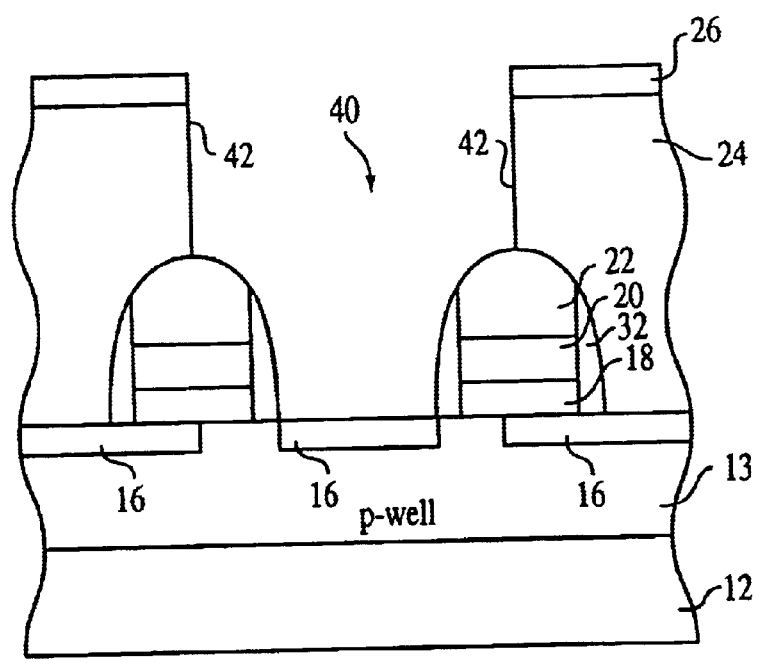
FIG. 3 is a schematic cross-sectional view of the FIG. 1 device at a subsequent step to that in FIG. 2.

A conventional SAC etch process is illustrated in FIGS. 2–3. These figures show a middle portion of the FIG. 1 structure. The FIG. 2 structure includes a substrate 12 having a p-well 13, which is typically doped to a predetermined conductivity, e.g. p-type or n-type depending on whether NMOS or PMOS transistors will be formed therein. The structure further includes field oxide regions 14 (not shown), conventional doped active areas 16, and a pair of gate stacks 30, all formed according to well-known semiconductor processing techniques. The gate stacks 30 include an oxide layer 18, a conductive layer 20, such as polysilicon, nitride spacers 32 and a nitride cap 22.

Above the gate oxide region, the polysilicon gates, and the protective nitride regions, an insulating layer 24 is disposed. Insulating layer 24 could be, for example, borophosphosilicate glass (BPSG), borosilicate glass (BSG), or phosphosilicate glass (PSG).

To create a contact opening 40 (FIG. 3) into semiconductor substrate 10 through oxide layer 24, a photoresist material 26 is deposited and patterned using conventional photolithography steps. After patterning, an initial opening 27 (FIG. 2) is created in photoresist layer 26 to facilitate subsequent oxide etching. The structure of FIG. 2 is then etched and, as shown in FIG. 3, a contact opening 40 is formed through oxide layer 24. The contact opening 40 of FIG. 2 is etched so that contact opening 40 contacts a source or drain region 16 of substrate 12.

In a self-aligned contact technique it is desirable that the contact opening, such as contact opening 40 of FIG. 3, be etched without serious damage to the insulating nitride regions overlying the polysilicon gates. That is, the contact opening must be etched with an oxide etch process that has a high oxide-to-nitride selectivity. This is impractical, however, when refractory metal silicide layers are employed for the gate stacks formation as part of the integration of the SAC and salicide processes. As described in the background section, the salicide gate stacks do not have a dielectric cap to allow them to undergo SAC etch processes. The present invention addresses this problem by providing the salicide gate stack with a layer of cap material overlying the gate, which is sufficient to protect the gate stack during the SAC etch. The cap dielectric material further allows the use of both the salicide and SAC processes in semiconductor device fabrication.

One embodiment of the present invention fabricated according to the process of the present invention is illustrated in FIGS. 4–13. This embodiment is a multi-layer structure having a dielectric cap material on top of the silicide gate stack in accordance with the present invention. The resulting multi-layer structure depicted in FIG. 13 can be subsequently used in a self-aligned contact etch process.

Figure 4:
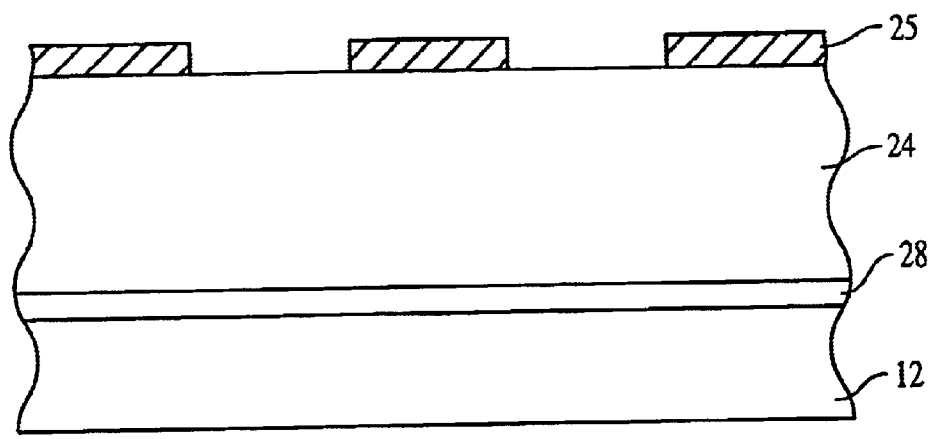
FIG. 4 is a schematic cross sectional views of a substrate on which a sificide cobalt gate stack structure is formed in accordance with a method of the present invention.

As shown in FIG. 4, a gate stack formation according to the present invention begins with the deposition of a TEOS layer 28 on silicon layer 12. TEOS layer 28 is needed primarily as a barrier to prevent materials that will be applied at subsequent processing steps from penetrating silicon layer 12.

Next, sacrificial oxide layer 24 is deposited over TEOS layer 28 of substrate 12. The oxide layer 24 may consist of substantially undoped silicon dioxide or doped silicon oxide. The undoped silicon dioxide can be formed thermally, by plasma enhanced chemical vapor deposition (PECVD), by low pressure chemical vapor deposition (LPCVD), by a conventional TEOS precursor deposition that is preferably rich in carbon or hydrogen, or by a precursor of gaseous silane ($SiH_4$) with oxygen.

When doped silicon oxide is used, it is preferable that silicon oxide layer 24 be substantially composed of borophosphosilicate glass (BPSG), borosilicate glass (BSG), or phosphosilicate glass (PSG). It is even more preferable that doped silicon dioxide region 24 be composed of silicon dioxide having doping of about 3% or more for boron and about 3% or more for phosphorus.

According to a preferred embodiment of the present invention, and as shown in FIG. 4, the oxide layer 24 is doped and formed of BPSG with a TEOS underlying layer 28, at a temperature between about 400° C. to 800° C., to a thickness between about 3000 Å to 10000 Å.

Figure 5:
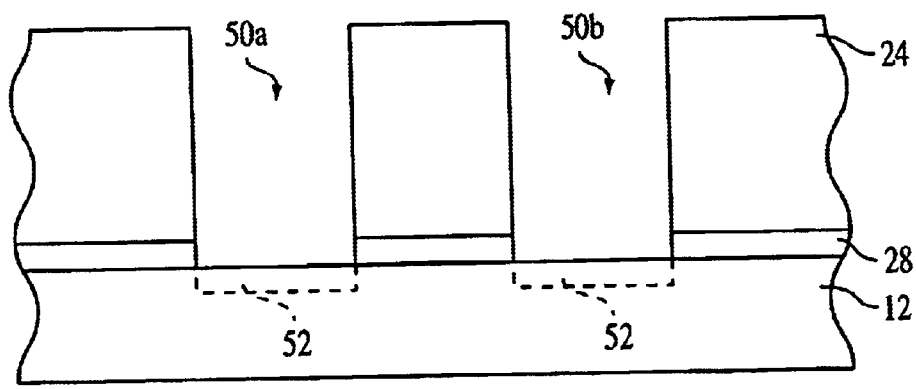
FIG. 5 is a schematic cross sectional views of a substrate on which a silicide cobalt gate stack structure is formed at a stage subsequent to that shown in FIG. 4.

Referring now to FIG. 5, the BPSG oxide layer 24 and the underlying TEOS layer 28 of substrate 12 are etched out by a directional etching process such as reactive ion etch (RIE). The mask 25 (FIG. 4) delineates regions 50a and 50b where the gates will be formed during subsequent steps. After the openings where the gates will be later formed are etched, mask 25 is removed.

At the end of the etch process described above, the exposed silicon surfaces of silicon layer 12 are further cleaned so that any damaged surface layers are removed. The damaged silicon surfaces are shown in FIG. 5 as regions 52. At this step, a soft and/or a wet etch is employed to clean out the damaged silicon surfaces 52. The etch employed to clean out the damaged silicon surfaces could be any soft etch, such as downstream plasma processing using $NF_3$ as an etchant.

Figure 6:
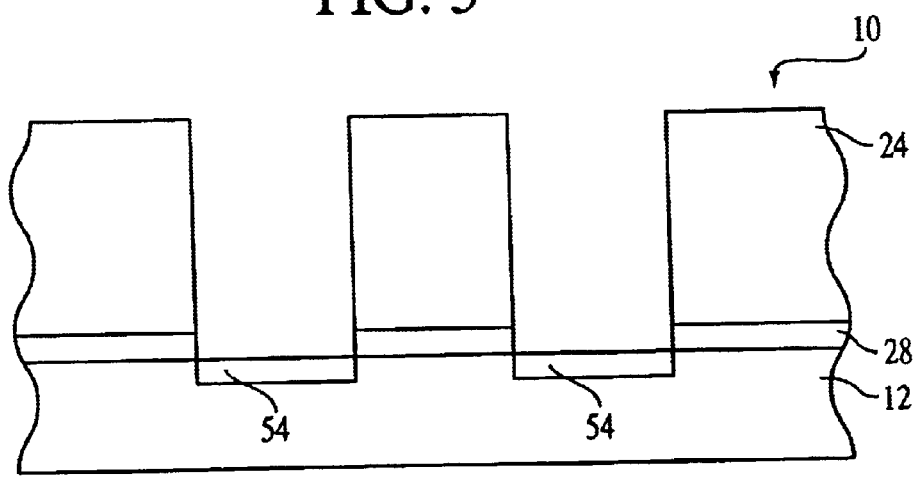
FIG. 6 is a schematic cross sectional views of a substrate on which a silicide cobalt gate stack structure is formed at a stage subsequent to that shown in FIG. 5.

Referring now to FIG. 6, gate oxide layers 54 are grown on the newly cleaned silicon surfaces, in openings 50a and 50b. It is important to note that the gate oxide layers 54 are not deposited but rather grown up and down, mostly into the silicon layer 12. Deposited oxide layers have a higher impurity content and therefore are undesirable since the impurities may easily affect the gate performance. As such, thin gate oxide layers 54 are thermally grown in an oxygen-steam ambient, at a temperature between about 750° C. to 1000° C., to a thickness between about 30 Å to 150 Å.

Figure 7:
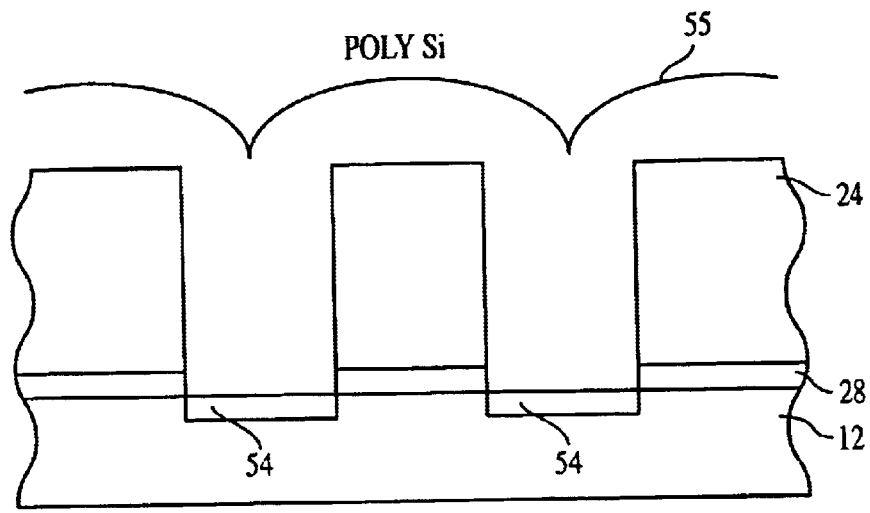
FIG. 7 is a schematic cross sectional views of a substrate on which a silicide cobalt gate stack structure is formed at a stage subsequent to that shown in FIG. 6.
Figure 8:
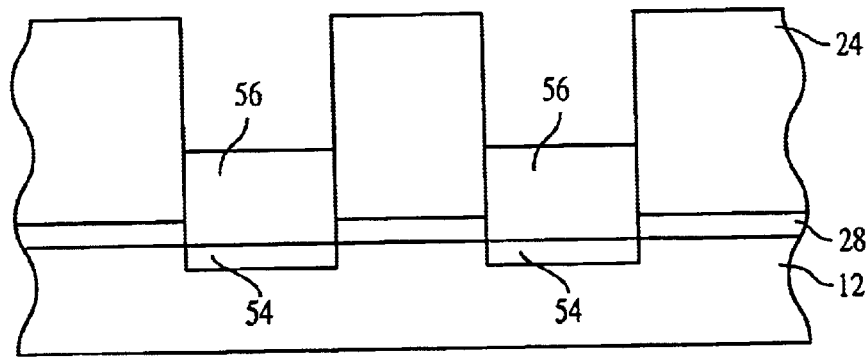
FIG. 8 is a schematic cross sectional views of a substrate on which a silicide cobalt gate stack structure is formed at a stage subsequent to that shown in FIG. 7.

As illustrated in FIGS. 7–8, a polysilicon layer (55 in FIG. 7) (56 in FIG. 8) is deposited over the gate oxide layers 54 via LPCVD procedures, at a temperature between about 300° C. to 700° C. The newly deposited polysilicon layer is subsequently etched selective to the sacrificial oxide BPSG layer 24, so that the remaining polysilicon layers 56 of FIG. 8 are formed to a thickness between about 500 Å to 1500 Å. This thickness must be sufficient for the reaction with the silicide metal, deposited in a subsequent step shown in FIG. 9, and for the gate itself.

Figure 9:
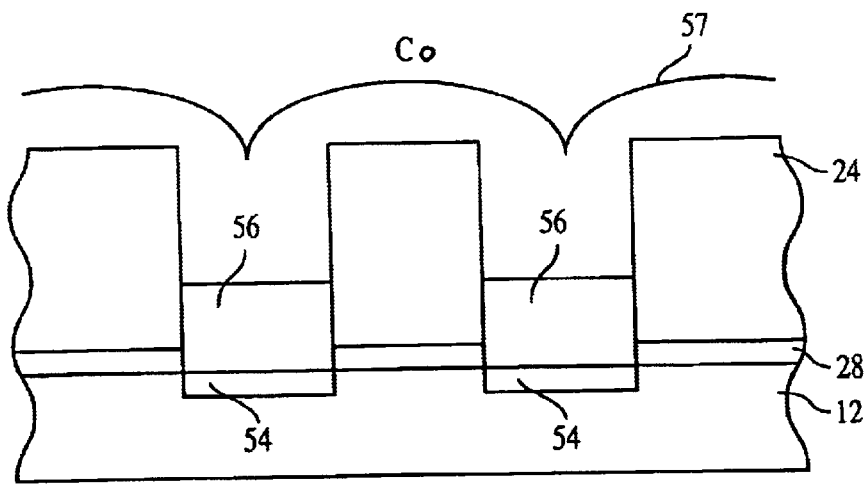
FIG. 9 is a schematic cross sectional views of a substrate on which a silicide cobalt gate stack structure is formed at a stage subsequent to that shown in FIG. 8.
Figure 10:
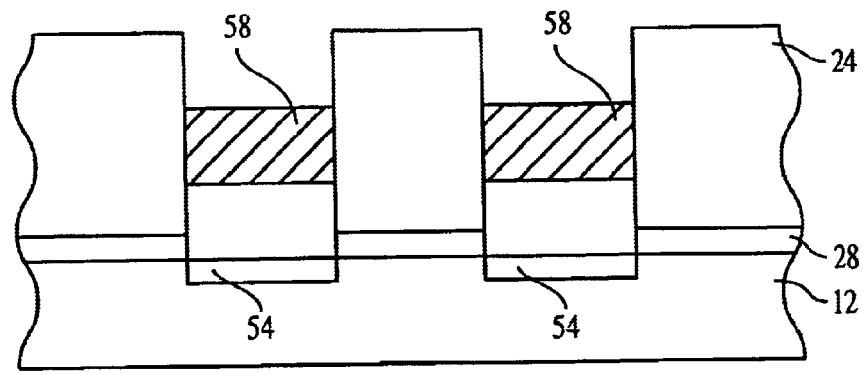
FIG. 10 is a schematic cross sectional views of a substrate on which a sidicide cobalt gate stack structure is formed at a stage subsequent to that shown in FIG. 9.

Referring now to FIGS. 9–10, a layer of metal capable of forming a silicide (57 in FIG. 9) (58 in FIG. 10) is deposited over the entire substrate 12 to a thickness between 200 Å to 500 Å. A preferred method for depositing the refractory metal is sputtering (RF or DC) but other similar methods such as CVD can be used. Preferably, the refractory metal is substantially composed of cobalt because of its lowered resistance and low resistivity as a silicide. However, refractory metal silicide may comprise any refractory metal, including but not limited to, titanium, tungsten, tantalum, molybdenum, and platinum.

Subsequent to the cobalt deposition, substrate 12 undergoes a rapid thermal anneal (RTA), using conventional furnace procedures, typically at about 10 to 60 seconds, in an RTA apparatus, using a $N_2$ ambient, at about 800° C. to 850° C., so that the deposited cobalt in direct contact with the polysilicon layers 56 is converted to its silicide. As shown in FIG. 10, the silicide regions 58 form conductive regions on top of polysilicon gates 56.

At this point, a selective etchant, such as ammonium hydroxide and hydrogen peroxide in water, may be used to remove all unreacted cobalt (not shown), that is all cobalt that was in contact with the silicon oxide 24 rather than with the polysilicon 56.

Figure 11:
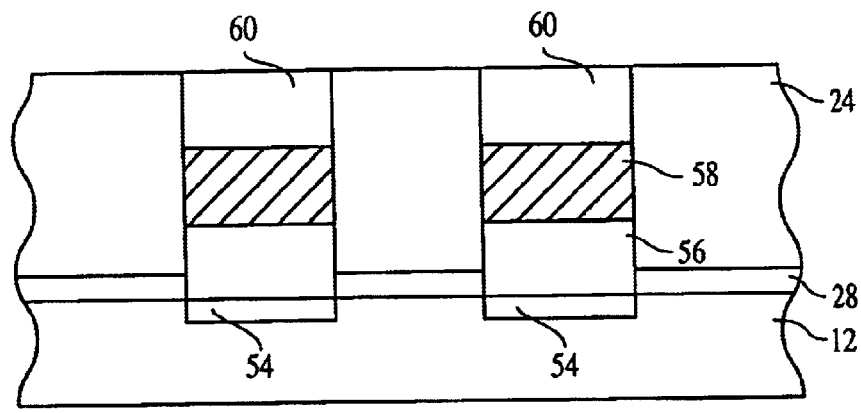
FIG. 11 is a schematic cross sectional views of a substrate on which a silicide cobalt gate stack structure is formed at a stage subsequent to that shown in FIG. 10.

Referring now to FIG. 11, a cap material is deposited over substrate 10 and the substrate top surface is planarized by, for example, a CMP process, so that cap regions 60 are formed over silicide regions 58. The cap material may be formed of silicon dielectrics, such as silicon nitride or silicon oxide. Silicon nitride ($Si_3N_4$) ("nitride") is preferred, however, because of its unique protective qualities such as moisture resistance, hardness, high dielectric strength, and resistance to oxidation. TEOS or silicon carbides may be used also.

Preferably, the cap regions 60 are deposited via PECVD procedures, at a temperature between about 300° C. to 600°

C., to a thickness between about 1000 Å to 2000 Å. After deposition, the silicon dielectric forming the cap regions 60 is chemically metal polished (CMP), so that any silicon nitride be removed from the BPSG oxide layer 24, leaving the silicon nitride material only over the silicide regions 58, as shown in FIG. 11.

Figure 12:
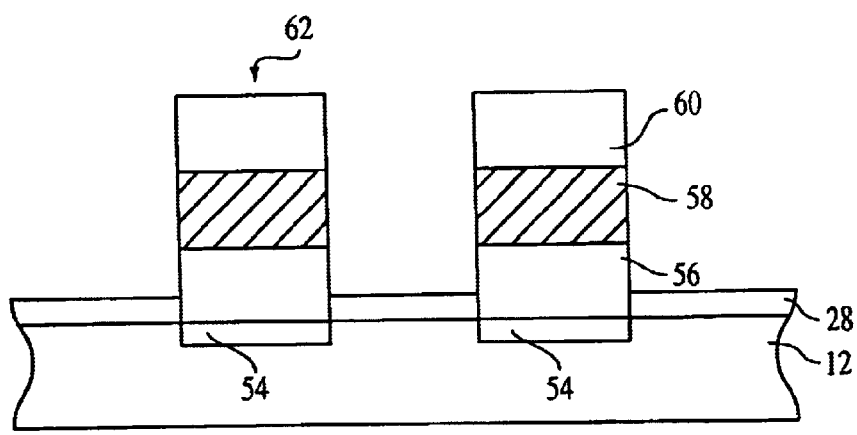
FIG. 12 is a schematic cross sectional views of a substrate on which a silicide cobalt gate stack structure is formed at a stage subsequent to that shown in FIG. 11.
Figure 13:
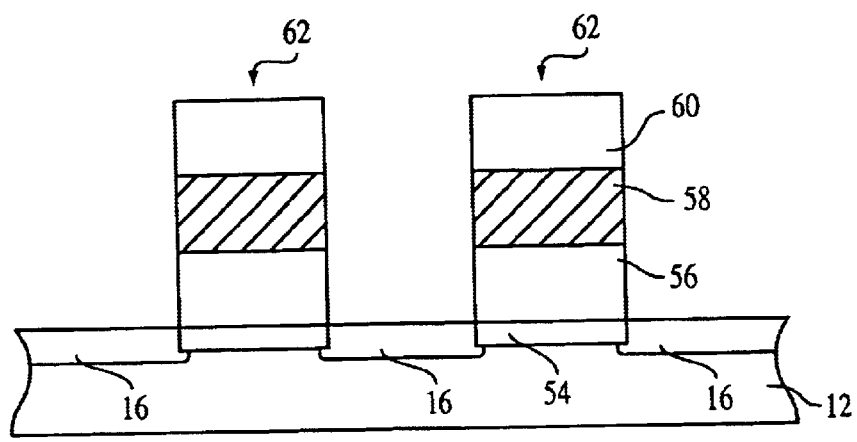
FIG. 13 is a schematic cross sectional views of a substrate on which a silicide cobalt gate stack structure is formed at a stage subsequent to that shown in FIG. 12.

In a subsequent step, the BPSG oxide layer 24 and the TEOS layer 28 are selectively etched to the gate stacks that have the newly-formed nitride caps 60. FIG. 12 illustrates substrate 10 after the etch of BPSG oxide layer 24 selective to nitride regions 60 and TEOS layer 28. Similarly, FIG. 13 illustrates substrate 10 after the etch of TEOS layer. The BPSG oxide layer and the TEOS layer 28 may also both be etched away together.

The etching of the BPSG and TEOS layers may be achieved by wet etching processes or dry etching processes. Dry etching processes are typically used since it allows the simultaneous etching of both BPSG and TEOS layers selective to the nitride caps on top of the gate stacks. This way, the etching of the BPSG allows also all TEOS to be taken off in the same process chamber, only by changing the etch chemistry slightly. For example, the BPSG and TEOS layers may be plasma etched under the following conditions:

| | |
|---|---|
| Pressure: | 30 mT |
| RF Power: | 500 W |
| Magnetic Field: | 40 Gauss |
| Cathode Temperature: | 20 Celsius |
| Gas Flows: | |
| $CF_4$ | 20 sccm |
| $CHF_3$ | 25 sccm |
| $CH_2F_2$ | 20 sccm |
| Ar | 160 sccm |

The etching of the BPSG and TEOS layers can be also achieved by a wet etch first, followed by a dry etch. As such, removal of the BPSG layer leaving the TEOS layer is accomplished by using a wet etch, for example a 30:1 acetic acid/hydrofluoric acid solution that will etch first the BPSG selective to the nitride caps and the TEOS oxide. Subsequent to the wet etch, a typical dry etch is applied. The dry etch then etches the TEOS oxide layer selective to the nitride cap.

At this point, a normal silicide gate stack structure, such as structure 62 of FIGS. 12 and 13, having a nitride cap 60 is left. The silicide gate stack structure 62 may now be used in a conventional implant process where the gate structure is needed to mask the dopant implantation of the source/drain regions of the adjacent transistors defined by the gate stacks. Next, the gate stacks are prepared to undergo a standard SAC etch.

Figure 14:
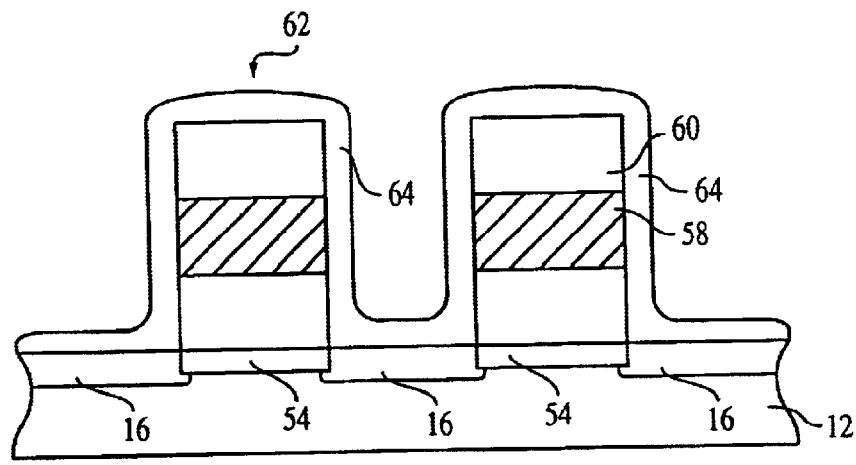
FIG. 14 is a schematic cross sectional views of a substrate on which a silicide cobalt gate stack structure undergoes a self-aligned contact etch in accordance with a method of the present invention.
Figure 15:
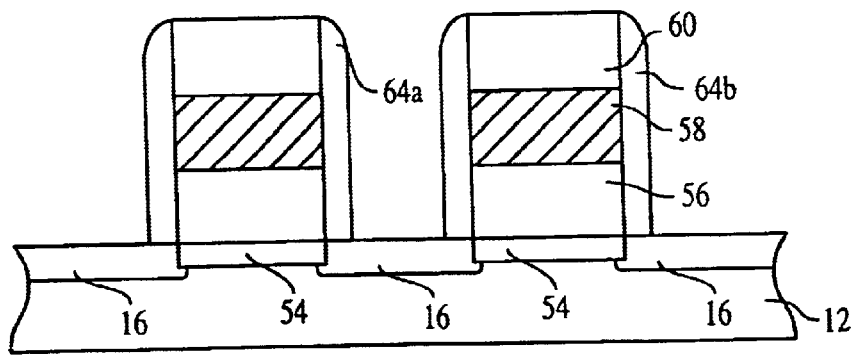
FIG. 15 is a schematic cross sectional views of a substrate on which a silicide cobalt gate stack structure undergoes a self-aligned contact etch at a stage subsequent to that shown in FIG. 14.

Referring now to FIG. 14, the next step in the flow process is the nitride spacer deposition. The nitride regions 32 of FIGS. 2 and 3 correspond to nitride spacers 64 of FIG. 14. The silicide gate stack structures 62, protected by nitride spacers 64, are further subjected to a spacer etch to remove silicon nitride from the surface of substrate 12, leaving spacers 64a and 64b as shown in FIG. 15.

Figure 16:
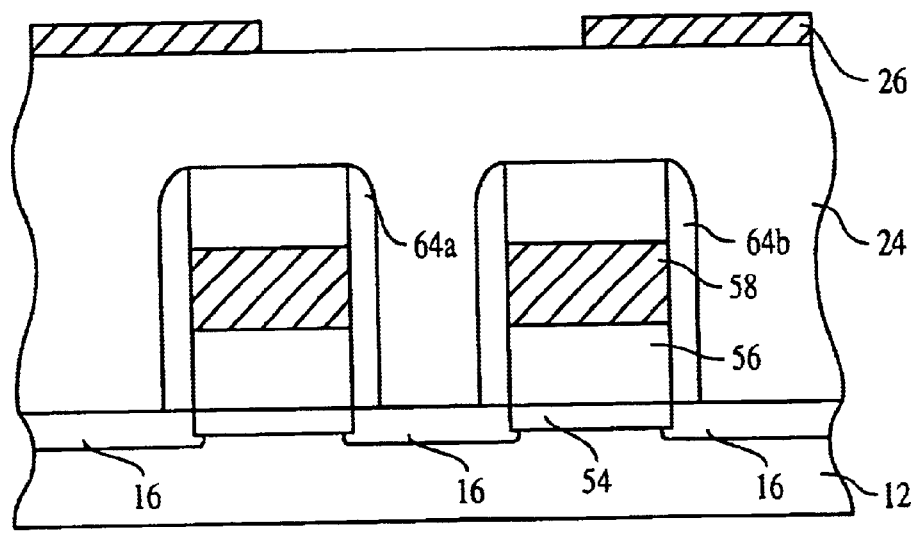
FIG. 16 is a schematic cross sectional views of a substrate on which a silicide cobalt gate stack structure undergoes a self-aligned contact etch at a stage subsequent to that shown in FIG. 15.
Figure 17:
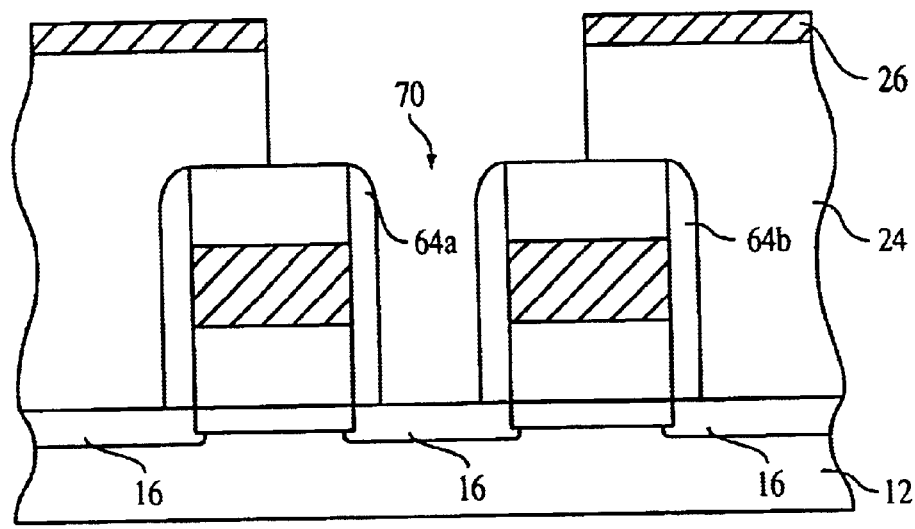
FIG. 17 is a schematic cross sectional views of a substrate on which a silicide cobalt gate stack structure undergoes a self-aligned contact etch at a stage subsequent to that shown in FIG. 16.

Referring to FIG. 16, an oxide layer 24, for example BPSG or the like, is now deposited over the substrate 12 and the silicide gate stack structures 62, which are protected by nitride caps 64a and 64b. To create a contact opening 70 into semiconductor substrate 12 through oxide layer 24, a photoresist material 26 is deposited and patterned using conventional photolithography steps. As illustrated in FIG. 17, after patterning and subsequent oxide etching, the self-aligned contact hole 70 is created. Conventional processing steps can now be carried out to form a conductor in contact hole 70 and other structures necessary to produce a semiconductor device, for example, a memory device.

The above description illustrates preferred embodiments which achieve the features and advantages of the present invention. It is not intended that the present invention be limited to the illustrated embodiments. Modifications and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. A method for forming a gate structure for a semiconductor device, comprising:

forming an opening using a directional etching process in an insulating layer over a semiconductor substrate;

growing a gate oxide at the bottom of said opening;

forming a conductive gate comprising polysilicon in said opening on said gate oxide, said conductive gate having a thickness within the range of approximately 500 to 1500 Angstroms;

forming a silicide layer in said opening on said conductive gate by a salicide method, said silicide layer having a thickness within the range of approximately 200 to 500 Angstroms, said salicide method comprising:

depositing a refractory metal capable of forming a silicide over said polysilicon gate;

annealing said refractory metal such that refractory metal in contact with said polysilicon is converted to a conductive silicide; and selectively etching to remove refractory metal not converted to conductive silicide;

forming an etch protective cap within said opening over a top surface of said silicide layer, said cap being sufficient to protect said conductive gate and silicide layer from being etched during a self-aligned contact etching process, employing said gate structure;

subsequently etching away said insulating layer; and forming an insulating spacer on side walls of said gate structure.

2. The method of claim 1, wherein said cap is formed of silicon-based insulator.

3. The method of claim 2, wherein said insulator is selected from the group consisting of silicon nitride and silicon oxide.

4. The method of claim 2, wherein said cap has a thickness within the range of approximately 1000 to 2000 Angstroms.

5. The method of claim 1, wherein said conductive gate is formed of polysilicon.

6. The method of claim 1, wherein said silicide layer is formed from a metal selected from the group consisting of cobalt, titanium, tungsten, tantalum, molybdenum, and platinum.

7. The method of claim 1, wherein said insulating spacer is formed of silicon nitride.

8. The method of claim 1, wherein said step of etching away said insulating layer comprises etching said insulating layer with an etchant selected from the group consisting of $C_2F_6$, $CH_4$, $C_3F_8$, $C_4H_{10}$, $C_2F_8$, $CH_2F_2$, $CHF_3$, $C_2HF_5$, and $CH_3F$.

9. The method of claim 8, wherein said etching of said insulating layer is a reactive ion etch (RIE) employing a composition comprising a $CF_4/CHF_3/CH_2F_2/Ar$ gas mixture at volume ratio 1:1:1:8.

10. A method for forming features of a semiconductor device, comprising:

forming a gate stack in an opening of a first insulating layer formed over a semiconductor substrate, said gate stack including an oxide layer grown on said substrate, a conductive layer comprising polysilicon in said opening over said oxide layer, a silicide layer in said opening over said conductive layer formed by a salicide process and a cap layer over said silicide layer, said conductive layer having a thickness within the range of approximately 500 to 1500 Angstroms, said salicide process comprising:

depositing a refractory metal capable of forming a suicide over said polysilicon gate;

annealing said refractory metal such that refractory metal in contact with said polysilicon is converted to a conductive silicide; and selectively etching to remove refractory metal not converted to conductive silicide;

etching away said first insulating layer to leave said gate stack with an etchant selected from the group consisting of $C_2F_6$, $CH_4$, $C_3F_8$, $C_4H_{10}$, $C_2F_8$, $CH_2F_2$, $CHF_3$, $C_2HF_5$, and $CH_3F$;

providing a second insulating layer over said substrate and said gate stack;

performing a self-aligned contact etch of said second insulating layer using said gate stack to align said etch; and forming an insulating spacer on side walls of said gate stack.

11. The method of claim 10, wherein said etching of said first insulating layer is a reactive ion etch (RIE) employing a composition comprising a $CF_4/CHF_3/CH_2F_2/Ar$ gas mixture at volume ratio 1:1:1:8.

12. The method of claim 10, wherein said cap layer of said gate stack is formed of silicon-based insulator.

13. The method of claim 10, wherein said insulator is selected from the group consisting of silicon nitride and silicon oxide.

14. The method of claim 10, wherein said cap layer of said gate stack has a thickness within the range of approximately 1000 to 2000 Angstroms.

15. The method of claim 10, wherein said conductive layer of said gate stack is formed of polysilicon.

16. The method of claim 10, wherein said silicide layer is formed from a metal selected from the group consisting of cobalt, titanium, tungsten, tantalum, molybdenum, and platinum.

17. The method of claim 10, wherein said silicide layer has a thickness within the range of approximately 200 to 500 Angstroms.

18. A method for forming a gate structure for a semiconductor device, comprising:

forming an insulating layer over a substrate;

masking said insulating layer to define an etching area on top of said insulating layer;

etching said insulating layer at said etching area down to a top surface of said substrate to form an opening into said insulating layer;

growing a gate oxide layer on said substrate at the bottom of said opening;

depositing a polysilicon layer in said opening over said gate oxide layer;

etching said polysilicon layer to form a polysilicon gate over said gate oxide layer, said polysilicon gate having a thickness within the range of approximately 500 to 1500 Angstroms;

depositing a refractory metal over said polysilicon gate;

converting said refractory metal in contact with said polysilicon gate in said opening to a silicide;

selectively etching said refractory metal to remove refractory metal not converted to silicide;

forming an etch protective cap in said opening over a top surface of said silicide layer;

etching away said insulating layer to leave a gate stack comprising said oxide layer, said polysilicon gate, said silicide layer, and said protective cap; and forming an insulating spacer on side walls of said gate stack.

19. The method of claim 18, wherein said cap is sufficient to protect said conductive gate and silicide layer from being etched during a self-aligned contact etching process, employing said gate structure.

20. The method of claim 18 further comprising forming a barrier layer over said substrate prior to the formation of said insulating layer over said substrate.

21. The method of claim 20 further comprising etching away of said barrier layer.

22. The method of claim 18, wherein said insulating layer is selected from the group consisting of BPSG, BSG, and PSG.

23. The method of claim 18, wherein said barrier layer is TEOS.

24. The method of claim 18, wherein etching of said insulating layer to form said opening employs a reactive ion etch (RIE).

25. The method of claim 18, wherein etching of said insulating layer to form said opening employs a wet etch.

26. The method of claim 18, wherein said gate oxide layer has a thickness within the range of approximately 30 to 150 Angstroms.

27. The method of claim 18, wherein said refractory metal is selected from the group consisting of cobalt, titanium, tungsten, tantalum, molybdenum, and platinum.

28. The method of claim 18, wherein said silicide layer has a thickness within the range of approximately 200 to 500 Angstroms.

29. The method of claim 18, wherein said cap is formed of silicon-based insulator.

30. The method of claim 29, wherein said insulator is selected from the group consisting of silicon nitride and silicon oxide.

31. The method of claim 18, wherein said cap has a thickness within the range of approximately 1000 to 2000 Angstroms.

32. The method of claim 21, wherein saidsteps of etching away of said insulating layer and said barrier layer employ an etchant selected from the group consisting of $C_2F_6$, $CH_4$, $C_3F_8$, $C_4H_{10}$, $C_2F_8$, $CH_2F_2$, $CHF_3$, $C_2HF_5$, and $CH_3F$.

33. The method of claim 21, wherein said etching away of said insulating layer and said barrier layer is a reactive ion etch (RIE) employing a composition comprising a $CF_4/CHF_3/CH_2F_2/Ar$ gas mixture at volume ratio 1:1:1:8.

34. The method of claim 18, wherein said insulating spacer is formed of silicon nitride.

* * * * *

UNITED STATES PATENT AND TRADEMARK OFFICE
CERTIFICATE OF CORRECTION

PATENT NO.    : 6,638,843 B1
DATED         : October 28, 2003
INVENTOR(S)   : Max F. Hineman It is certified that error appears in the above-identified patent and that said Letters Patent is hereby corrected as shown below:

Column 8,
Line 64, replace "$C_4$, $H_{10}$" with -- $C_4H_{10}$ --

Column 9,
Line 16, replace "suicide" with -- silicide --
Line 40, replace "10" with -- 12 --

Signed and Sealed this

Thirtieth Day of December, 2003

JAMES E. ROGAN
*Director of the United States Patent and Trademark Office*